(12) United States Patent
Takamaru et al.

(10) Patent No.: US 9,305,939 B2
(45) Date of Patent: Apr. 5, 2016

(54) SEMICONDUCTOR DEVICE WITH OXIDE LAYER AS TRANSPARENT ELECTRODE

(71) Applicant: Sharp Kabushiki Kaisha, Osaka (JP)

(72) Inventors: Yutaka Takamaru, Osaka (JP); Tadayoshi Miyamoto, Osaka (JP); Kazuatsu Ito, Osaka (JP); Shigeyasu Mori, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/406,046

(22) PCT Filed: May 28, 2013

(86) PCT No.: PCT/JP2013/064783
§ 371 (c)(1),
(2) Date: Dec. 5, 2014

(87) PCT Pub. No.: WO2013/183495
PCT Pub. Date: Dec. 12, 2013

(65) Prior Publication Data
US 2015/0129867 A1 May 14, 2015

(30) Foreign Application Priority Data
Jun. 8, 2012 (JP) .................. 2012-130738

(51) Int. Cl.
*H01L 27/12* (2006.01)
*H01L 29/66* (2006.01)
*H01L 29/786* (2006.01)

(52) U.S. Cl.
CPC ........ *H01L 27/1225* (2013.01); *H01L 27/1259* (2013.01); *H01L 29/66969* (2013.01); *H01L 29/7869* (2013.01); *H01L 29/78633* (2013.01)

(58) Field of Classification Search
CPC ............ G06F 2201/40; G06F 2201/50; G06F 1/136213; H01L 29/45; H01L 27/1225; H01L 29/7869; H01L 21/02565; H01L 21/44; H01L 23/564
USPC ............................................. 257/43; 438/104
See application file for complete search history.

(56) References Cited

U.S. PATENT DOCUMENTS

| 5,708,485 A | 1/1998 | Sato et al. |
| 6,344,885 B1 | 2/2002 | Mori et al. |
| 2005/0218407 A1 | 10/2005 | Matsuura et al. |

(Continued)

FOREIGN PATENT DOCUMENTS

| JP | 1-129234 A | 5/1989 |
| JP | 5-61066 A | 3/1993 |
| JP | 8-213626 A | 8/1996 |
| JP | 8-262494 A | 10/1996 |

(Continued)

*Primary Examiner* — Evan Pert
*Assistant Examiner* — Changhyun Yi
(74) *Attorney, Agent, or Firm* — Chen Yoshimura LLP

(57) ABSTRACT

A semiconductor device has: a first transparent electrode, a drain electrode, and a source electrode formed on a substrate; an oxide layer joined electrically to the source electrode and the drain electrode and containing a semiconductor region; an insulating layer formed on the oxide layer and the first transparent electrode; a gate electrode formed on the insulating layer; and a second transparent electrode formed so as to overlap at least a part of the first transparent electrode with the insulating layer interposed therebetween. The oxide layer and the first transparent electrode are formed of the same oxide film.

12 Claims, 7 Drawing Sheets

(56) References Cited

U.S. PATENT DOCUMENTS

| | | |
|---|---|---|
| 2008/0093602 A1 | 4/2008 | Matsumura et al. |
| 2008/0218058 A1* | 9/2008 | Son ............................. 313/500 |
| 2009/0065771 A1 | 3/2009 | Iwasaki et al. |
| 2011/0108830 A1* | 5/2011 | Park et al. ...................... 257/43 |
| 2011/0204362 A1 | 8/2011 | Akimoto et al. |
| 2012/0138922 A1* | 6/2012 | Yamazaki et al. .............. 257/43 |
| 2012/0168755 A1* | 7/2012 | Choi ................................ 257/59 |
| 2012/0292610 A1* | 11/2012 | Wang et al. ..................... 257/43 |
| 2013/0069055 A1 | 3/2013 | Yamazaki et al. |
| 2014/0361295 A1 | 12/2014 | Miyamoto et al. |

FOREIGN PATENT DOCUMENTS

| | | |
|---|---|---|
| JP | 10-96956 A | 4/1998 |
| JP | 11-298002 A | 10/1999 |
| JP | 2005-64337 A | 3/2005 |
| JP | 2007-250983 A | 9/2007 |
| JP | 2008-103609 A | 5/2008 |
| JP | 2011-192974 A | 9/2011 |
| JP | 2013-84925 A | 5/2013 |
| WO | 2013/115050 A1 | 8/2013 |
| WO | 2013/115051 A1 | 8/2013 |
| WO | 2013/115052 A1 | 8/2013 |

* cited by examiner (a)

(b)

(a)

(b)

(a)

(b)

(a)

(b)

(c)

(d)

(e)

(f)

(a)

(b)

US 9,305,939 B2

SEMICONDUCTOR DEVICE WITH OXIDE LAYER AS TRANSPARENT ELECTRODE

TECHNICAL FIELD

The present invention relates to a semiconductor device made of an oxide semiconductor and a method of manufacturing the same, and in particular, relates to an active matrix substrate of a liquid crystal display device or an organic EL display device and a method of manufacturing the same. Here, the semiconductor device includes the active matrix substrate and a display device including this.

BACKGROUND ART

An active matrix substrate used in liquid crystal display devices and the like has a switching element such as a thin film transistor (hereinafter, "TFT") in each pixel. An active matrix substrate including TFTs as switching elements is referred to as a TFT substrate.

TFTs having an amorphous silicon film as the active layer (hereinafter "amorphous silicon TFTs") or TFTs having a polycrystalline film as the active layer (hereinafter "polycrystalline silicon TFTs") are widely known.

The use of an oxide semiconductor as the material of the TFT active layer, instead of amorphous silicon or polycrystalline silicon, has been recently proposed. Such a TFT is referred to as an "oxide semiconductor TFT." Oxide semiconductors have a higher mobility than amorphous silicon. Therefore, the oxide semiconductor TFT can operate at a faster speed than the amorphous silicon TFT. Oxide semiconductor films are made by a simpler process than the polycrystalline silicon film.

Patent Document 1 discloses a method of manufacturing a semiconductor device by which miniaturization of oxide semiconductor TFTs is accomplished while maintaining excellent electrical characteristics.

Meanwhile, in recent years, liquid crystal display devices and the like become higher resolution, a decrease in aperture ratio of the pixels has become a problem. The aperture ratio of the pixel refers to the proportion of area taken up by the pixel in a display region (in a transmissive liquid crystal display device, for example, this refers to an area through which light passes through to contribute to display), and below, this is simply referred to as the "aperture ratio."

In particular mid- to small-size transmissive liquid crystal display device for mobile devices have a small display region, and thus, the individual pixels are also small in area, which means that there is a marked decrease in aperture ratio due to increased resolution. Furthermore, if the aperture ratio of liquid crystal display devices used for mobile devices is decreased, then in order to attain a desired brightness, the luminance of the backlight needs to be increased, which can increase the amount of power consumed.

In order to attain a high aperture ratio, the area taken up by elements made of non-transparent materials such as TFTs and auxiliary capacitance provided for each pixel can be made small, but there is a minimum required size for the TFTs and auxiliary capacitances in order for them to perform their functions. If oxide semiconductor TFTs are used as the TFTs, there is an advantage that the TFTs can be made smaller than if amorphous silicon TFTs are used. In order to maintain the voltage applied to the liquid crystal layer of the pixels (referred to as "liquid crystal capacitance" in electrical terms), the auxiliary capacitance is provided as a capacitance provided to be electrically parallel to the liquid crystal capacitance, and in generally, at least some of the auxiliary capacitance overlaps the pixels.

RELATED ART DOCUMENTS

Patent Documents

Patent Document 1: Japanese Patent Application Laid-Open Publication No. 2011-192974

SUMMARY OF THE INVENTION

Problems to be Solved by the Invention

However, whereas demand is high for increased aperture ratio, oxide semiconductor TFTs alone cannot meet this demand. Also, as display devices become inexpensive, there is also demand for the development of display devices having a high aperture ratio at a high resolution and inexpensive cost.

A main object of the present invention is to provide a semiconductor device and a method of manufacturing the same by which it is possible to make the manufacturing process simple and by which it is possible to attain a higher resolution and higher aperture ratio display device than in conventional devices.

Means for Solving the Problems

A semiconductor device according to an embodiment of the present invention includes: a substrate; a source electrode, a drain electrode, and a first transparent electrode formed on the substrate; an oxide layer electrically connected to the source electrode and the drain electrode, the oxide layer including a semiconductor region; an insulating layer formed on the oxide layer and the first transparent electrode; a gate electrode formed on the insulating layer; and a second transparent electrode formed over the insulating layer, overlapping at least a portion of the first transparent electrode, wherein the oxide layer and the first transparent electrode are formed of a same oxide film.

In an embodiment, the second transparent electrode is electrically connected to the drain electrode.

In an embodiment, the oxide layer includes a conductive region, and the second transparent electrode is electrically connected to the drain electrode through the conductive region.

In an embodiment, the first transparent electrode is electrically connected to the drain electrode.

In an embodiment, the first transparent electrode includes an impurity at a higher concentration than in the semiconductor region, and a portion of the insulating layer located over the first transparent electrode includes an impurity at a higher concentration than in other portions of the insulating layer.

In an embodiment, the semiconductor device further includes: a light-shielding layer formed on the substrate, wherein the semiconductor region is formed on the light-shielding layer.

In an embodiment, the oxide film includes In, Ga, and Zn.

A method of manufacturing a semiconductor device according to an embodiment of the present invention includes: (a) preparing a substrate; (b) forming a source electrode and a drain electrode on the substrate; (c) forming an oxide semiconductor layer on the source electrode and the drain electrode; (d) forming an insulating layer on the oxide semiconductor layer; (e) forming a gate electrode on the insulating layer so as to overlap a portion of the oxide semiconductor layer when viewed from a direction normal to the substrate; (f) forming a first transparent electrode by doping a portion of the oxide semiconductor layer with an impurity using the gate electrode as a mask; and (g) forming a second transparent electrode so as to overlap at least a portion of the first transparent electrode through the insulating layer.

In an embodiment, in the step (c), the oxide semiconductor layer includes a first oxide semiconductor layer formed on the source electrode and the drain electrode and a second oxide semiconductor layer not in contact with the first oxide semiconductor layer, and the step (f) includes a step (f1) of forming the first transparent electrode by doping at least a portion of the second oxide semiconductor layer with the impurity.

In an embodiment, the step (f) includes a step (f2) of doping a portion of the first oxide semiconductor layer with the impurity.

In an embodiment, the method of manufacturing a semiconductor device further includes: (h) forming a light-shielding layer on the substrate between the step (a) and the step (b), wherein, in the step (b), a portion of the oxide semiconductor layer is formed on the light-shielding layer.

Effects of the Invention

By the embodiments of the present invention, a semiconductor device and a method of manufacturing the same by which it is possible to attain a display device having a higher resolution and higher aperture ratio than conventional devices without an increase in manufacturing cost are provided.

DETAILED DESCRIPTION OF EMBODIMENTS

A semiconductor device (TFT substrate) of an embodiment of the present invention will be described with reference to drawings. The semiconductor device of the present embodiment is provided with a thin film transistor (oxide semiconductor TFT) that has an active layer made of an oxide semiconductor. The semiconductor device of the present embodiment simply needs to include an oxide semiconductor TFT, and includes a wide range of active matrix substrates, various types of display devices, electronic devices, and the like.

Here, an embodiment of a semiconductor device will be described with an oxide semiconductor TFT used in a liquid crystal display device as an example. The TFT substrates described below have aspects in common with TFT substrates disclosed in International PCT Application No. PCT/JP2013/051422, International PCT Application No. PCT/JP2013/051415, and International PCT Application No. PCT/JP2013/051417, and thus, the contents of International PCT Application No. PCT/JP2013/051422, International PCT Application No. PCT/JP2013/051415, and International PCT Application No. PCT/JP2013/051417 are incorporated by reference herein.

Figure 1:
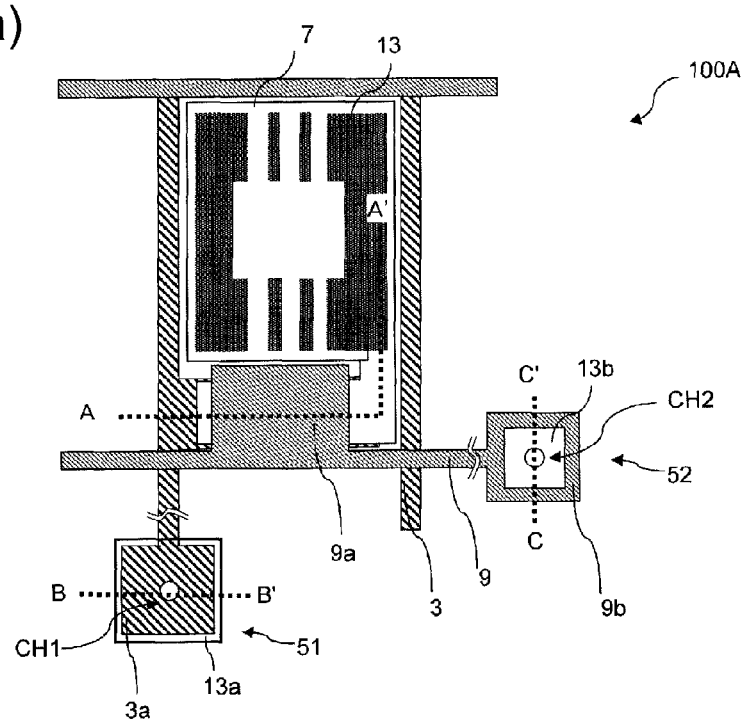
FIG. 1(a) is a schematic plan view of a TFT substrate 100A in an embodiment of the present invention.
FIG. 1(b) is a schematic cross-sectional view of the TFT substrate 100A along the line A-A' of FIG. 1(a).
Figure 1:
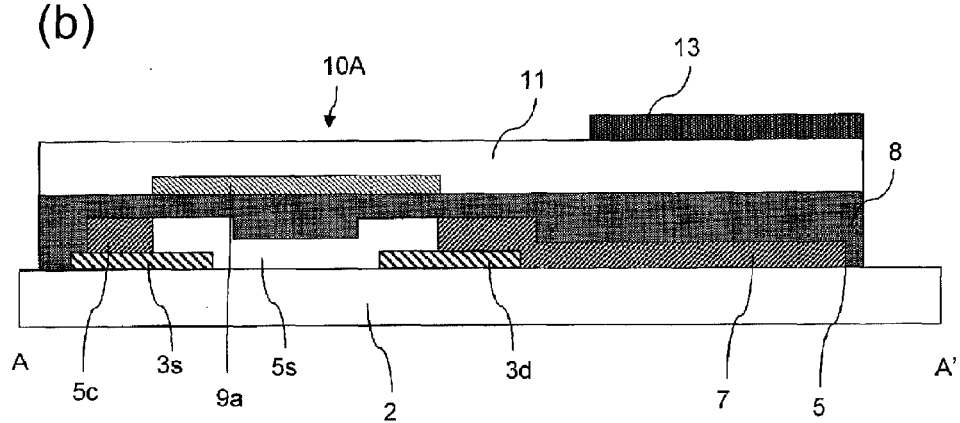
Figure 2:
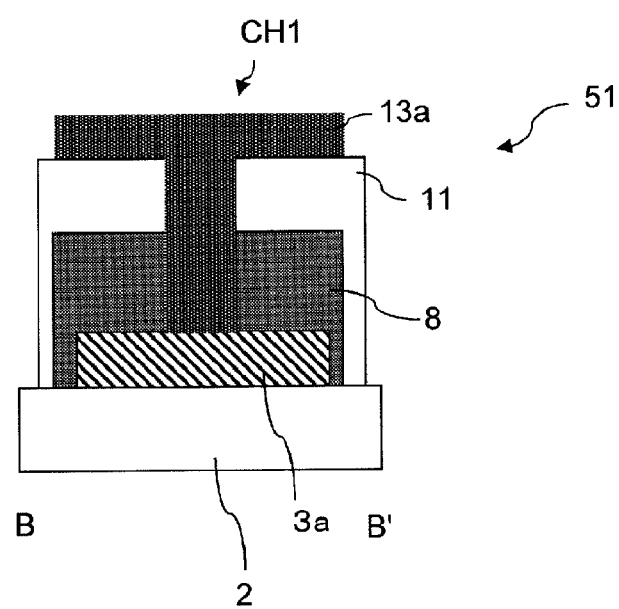
FIG. 2(a) is a schematic cross-sectional view of the TFT substrate 100A along the line B-B' of FIG. 1(a)
FIG. 2(b) is a schematic cross-sectional view of the TFT substrate 100A along the line C-C' of FIG. 1(a).
Figure 2:
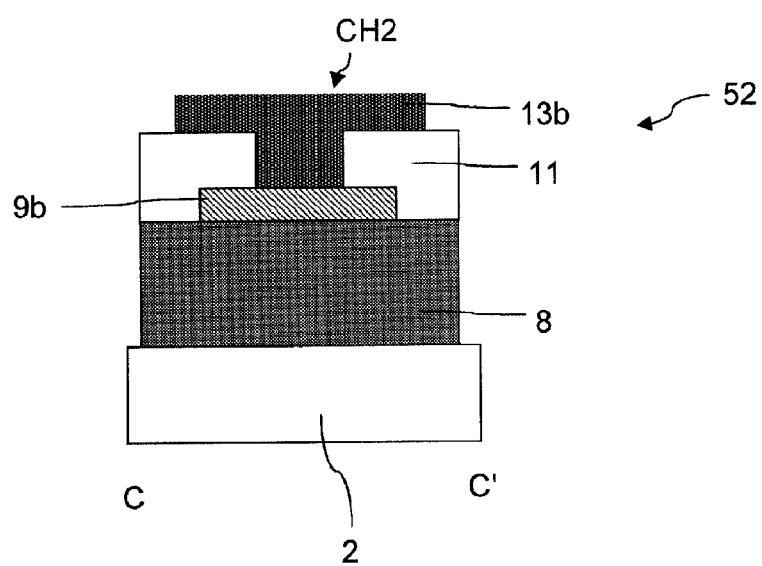

FIG. 1(a) is a schematic plan view of a TFT substrate 100A according to the present embodiment, and FIG. 1(b) is a schematic cross-sectional view of the TFT substrate 100A along the line A-A' of FIG. 1(a). The transparent electrode 13 shown in FIG. 1(a) in reality is formed so as to overlap the source wiring line 3 and the gate wiring line 9 when viewed from the direction normal to the substrate 2, but in the present application, the depiction of the transparent electrode 13 is simplified for ease of viewing. FIG. 2(a) is a schematic cross-sectional view of the TFT substrate 100A along the line B-B' of FIG. 1(a), and FIG. 2(b) is a schematic cross-sectional view of the TFT substrate 100A along the line C-C' of FIG. 1(a).

As shown in FIGS. 1(a) and 1(b), the TFT substrate 100A has a substrate 2, and a source electrode 3s, a drain electrode 3d, and a transparent electrode 7 formed on the substrate 2. Additionally, the TFT substrate 100A has an oxide layer 5 (sometimes referred to as the oxide semiconductor layer) that is electrically connected to the source electrode 3s and the drain electrode 3d and includes the semiconductor region 5s, and an insulating layer 8 formed on the oxide layer 5 and the transparent electrode 7. Also, the TFT substrate 100A has a gate electrode 9a formed on the insulating layer 8, and a transparent electrode 13 formed so as to overlap at least a portion of the transparent electrode 7 through the insulating layer 8. The oxide layer 5 and the transparent electrode 7 are formed of the same oxide film.

Although details are described later, the TFT substrate 100A is manufactured according to a simple manufacturing method, and can attain a higher resolution and higher aperture ratio display device than conventional devices.

In the TFT substrate 100A, the oxide layer 5 includes the semiconductor region 5s, a conductive region 5c, and a transparent electrode 7. The conductive region 5c and the transparent electrode 7 have a lower resistance than the semiconductor region 5s (with a sheet resistance of 100 kΩ/sq or less, and preferably 10 kΩ/sq or less, for example). Although this depends on the process for reducing resistance, the conductive region 5c and the transparent electrode 7 may include an impurity (boron, for example) at a higher concentration than the semiconductor region 5s. The semiconductor region 5s is disposed to overlap the gate electrode 9a through the insulating layer 8, and functions as the active layer of the TFT. The conductive region 5c and the transparent electrode 7 are in contact with the semiconductor region 5s, and the transparent electrode 7 can function as a pixel electrode, for example.

Although details are described later, the semiconductor region 5s is formed to be self-aligned with respect to the gate electrode 9a. Therefore, the edge of the semiconductor region 5s is almost completely aligned with the edge of the gate electrode 9a.

As shown in FIG. 1(b), the source electrode 3s and the drain electrode 3d are provided to contact the bottom surface of the oxide layer 5. The source electrode 3s is electrically connected to the source wiring line 3.

The insulating layer 8 is formed on the oxide layer 5, and the gate electrode 9a is formed on the insulating layer 8 to overlap the semiconductor region 5s of the oxide layer 5. The gate electrode 9a is electrically connected to a gate wiring line. The insulating layer 8 functions as a gate insulating layer.

A protective layer 11 is formed on the gate electrode 9a and the transparent electrode 13 is formed on the protective layer 11. At least a portion of the transparent electrode 13 is formed to overlap the transparent electrode 7 across the protective layer 11 and the insulating layer 8 when viewed in the direction normal to the substrate 2. As a result, an auxiliary capacitance is formed in a portion where the two transparent electrodes 7 and 13 overlap. The auxiliary capacitance is transparent (allows through visible light), and thus, the aperture ratio is not decreased. Therefore, the TFT substrate 100A can attain a higher aperture ratio than a TFT substrate including an auxiliary capacitance formed by non-transparent electrodes as in conventional configurations. The aperture ratio does not decrease as a result of the auxiliary capacitance, and thus, the auxiliary capacitance may be made larger as needed for the capacitance value of the auxiliary capacitance (area of auxiliary capacitance).

As shown in FIGS. 1(a) and 1(b), it is preferable that the transparent electrode 13 be formed so as not to overlap the oxide semiconductor TFT 10A in a direction normal to the substrate 2. In this manner, it is possible to prevent the electric field from the transparent electrode 13 from affecting the oxide semiconductor TFT 10A.

Although details will be described later, in the TFT substrate 100A, portions of the oxide layer 5 are given a lower resistance, and the transparent electrode 7 to be the pixel electrode is formed, for example, and the semiconductor region 5s to be the active layer of the TFT is formed from the remaining portion as the semiconductor.

In the TFT substrate 100A, the transparent electrode 7 is electrically connected to the drain electrode 3d and functions as a pixel electrode. It is preferable that a portion of the transparent electrode 7 be on the drain electrode 3d. With such a configuration, it is possible to form the pixel electrode up to the near edge of the drain electrode 3d, and thus, the TFT substrate 100A can attain a high aperture ratio.

The TFT substrate 100A has a source terminal 51 and a gate terminal 52.

As shown in FIGS. 1(a) and 2(a), the source terminal 51 has a source connective layer 3a that is electrically connected to the source wiring line 3, and a transparent connective layer 13a that is electrically connected to the source connective layer 3a. The transparent connective layer 13a is not electrically connected to the transparent electrode 13.

The source connective layer 3a is formed on the substrate 2, the insulating layer 8 is formed on the source connective layer 3a, and the protective layer 11 is formed on the insulating layer 8. The transparent connective layer 13a is formed on the protective layer 11, and is electrically connected to the source connective layer 3a through a contact hole CH1 formed in the insulating layer 8 and the protective layer 11.

As shown in FIGS. 1(a) and 2(b), the gate terminal 52 has a gate connective layer 9b electrically connected to the gate wiring line 9, and a transparent connective layer 13b electrically connected to the gate connective layer 9b. The transparent connective layer 13b is not electrically connected to the transparent electrode 13 or the transparent connective layer 13a.

The gate connective layer 9b is formed on the insulating layer 8 and the protective layer 11 is formed on the gate connective layer 9b. The transparent connective layer 13b is formed on the protective layer 11 and the transparent connective layer 13b is electrically connected to the gate connective layer 9b through a contact hole CH2 formed in the protective layer 11.

Next, the respective components of the TFT substrate 100A will be described in detail.

The substrate 2 is typically a transparent substrate, and is a glass substrate, for example. A plastic substrate can be used instead of a glass substrate. Plastic substrates include a substrate made of a thermosetting resin or a thermoplastic resin, or a composite substrate including these resins and inorganic fibers (glass fibers or non-woven fabric made of glass fibers). Polyethylene terephthalate (PET), polyethylene naphthalate (PEN), polyethersulfone (PES), acrylic resins, and polyimide resins are examples of heat resistant resin materials. When used in a reflective liquid crystal display device, a silicon substrate can be used as the substrate 2.

The source electrode 3s, the drain electrode 3d, the source connective layer 3a, and the source wiring line 3 are formed of a layered structure of Ti/Al/Ti, for example. Alternatively, the source electrode 3s, the drain electrode 3d, the source connective layer 3a, and the source wiring line 3 may have a layered structure of Mo/Al/Mo, a single layer structure, a two layer structure or a layered structure having four or more layers. Additionally, elements selected from among Al, Cr, Ta, Ti, Mo, and W, or an alloy or metal nitride including these elements may be used. The source electrode 3s, the drain electrode 3d, the source connective layer 3a, and the source wiring line 3 are respectively 50 nm to 600 nm in thickness, for example (approximately 350 nm in the present embodiment). The source connective layer 3a is electrically connected to the source wiring line 3.

The oxide layer 5 is an In—Ga—Zn—O film including In (indium), Ga (gallium), and Zn (zinc) at a 1:1:1 ratio. The ratio of In, Ga, and Zn can be appropriately chosen. Another oxide film besides an In—Ga—Zn—O film such as a Zn—O (ZnO) film, an In—Zn—O (IZO (registered trademark)) film, a Zn—Ti—O (ZTO) film, a Cd—Ge—O film, a Cd—Pd—O film, a CdO (cadmium oxide), or an Mg—Zn—O film may be used. Also, the oxide layer 5 can be made of ZnO that is amorphous or microcrystalline in a polycrystalline state or a mix of amorphous and polycrystalline states doped with one or more impurity elements selected from among group 1 elements, group 13 elements, group 14 elements, group 15 elements, group 17 elements, and the like, or not doped with any impurity elements. It is preferable that the oxide layer 5 be made of an amorphous oxide film. This is because an amorphous oxide semiconductor film can be manufactured at low temperature and can achieve a high mobility. The thickness of the oxide layer 5 is approximately 30 nm to 100 nm, for example (approximately 50 nm, for example).

The oxide layer 5 of the present embodiment has a high resistance portion functioning as a semiconductor, and a low resistance portion having a lower resistance than the high resistance portion. In the example shown in FIG. 1(b), the high resistance portion includes the semiconductor region 5s, and the low resistance portion includes the conductive region 5c and the transparent electrode 7. Such an oxide layer 5 is made by making a portion of the oxide semiconductor low resistance. Depending on how the portion is made low resistance, the low resistance portion sometimes includes a p-type impurity (B (boron), for example) or an n-type impurity (P (phosphorus), for example) at a higher concentration than the high resistance portion. The sheet resistance of the low resistance portion is 100 kΩ/sq or less, for example, and preferably 10 kΩ/sq or less.

The insulating layer 8 can be a single layer or multiple layers of $SiO_2$ (silicon oxide), $SiN_X$ (silicon nitride), $SiO_XN_Y$ (silicon nitride oxide, x>y), $SiN_XO_Y$ (silicon oxide nitride, x>y), $Al_2O_3$ (aluminum oxide), or tantalum oxide ($Ta_2O_5$), for example. The thickness of the insulating layer 8 is approximately 50 nm to 600 nm, for example. A suitable way to form a precise insulating layer 8 with a low gate leakage current at a low temperature is to use a noble gas such as Ar (argon) while forming the insulating layer 8. In the present embodiment, the lower layer of the insulating layer 8 is made of $SiO_2$, and the upper layer of the insulating layer 8 is made of $SiN_X$. The thickness of the lower layer is approximately 50 nm, for example, and the thickness of the upper layer is approximately 325 nm, for example.

The gate electrode 9a and the gate connective layer 9b are electrically connected to the gate wiring line 9. The gate electrode 9a, the gate connective layer 9b, and the gate wiring line 9 have a layered structure in which the top layer is a W (tungsten) layer, and the lower layer is a TaN (tantalum nitride) layer, for example. The thickness of the upper layer is approximately 370 nm, for example, and the thickness of the lower layer is approximately 50 nm, for example. Besides this, the gate electrode 9a and the gate wiring line 9 may have a layered structure of Mo (molybdenum)/Al (aluminum)/Mo, a single layer structure, a two layer structure, or a layered structure having four or more layers. The gate electrode 9a may be formed of an element selected from among Cu (copper), Al, Cr (chromium), Ta (tantalum), Ti (titanium), Mo, and W, or an alloy or metal nitride including these elements. The thickness of the gate electrode 9a, the gate connective layer 9b, and the gate wiring line 9 is 50 nm to 600 nm (approximately 420 nm in the present embodiment), for example.

The oxide semiconductor TFT 10A has a source electrode 3s and a drain electrode 3d, a portion of the oxide layer 5 including the semiconductor region 5s, a portion of the insulating layer 8, and the gate electrode 9a. The oxide semiconductor TFT 10A is a so-called top gate TFT.

The protective layer 11 can be made of a single layer or multiple layers of $SiO_2$ (silicon oxide), $SiN_X$ (silicon nitride), $SiO_XN_Y$ (silicon nitride oxide, x>y), $SiN_XO_Y$ (silicon oxide nitride, x>y), $Al_2O_3$ (aluminum oxide), or tantalum oxide ($Ta_2O_5$), for example. The thickness of the protective layer 11 is approximately 50 nm to 600 nm, for example. The protective layer 11 is made of $SiO_2$, for example, and the thickness thereof is approximately 200 nm, for example.

The transparent electrode 13 is made of a transparent conductive film such as ITO (indium tin oxide) or IZO (indium zinc oxide), for example. The thickness of the transparent electrode 13 is 50 nm to 600 nm, for example (approximately 100 nm in the present embodiment).

The TFT substrate 100A can have a light-shielding layer 21 formed on the substrate 2 to be described later, and a buffer layer 23 formed between the light-shielding layer 21 and the source electrode 3s and drain electrode 3d.

The TFT substrate 100A is used in a liquid crystal display device of the FFS (fringe field switching) type or the like.

Next, the method of manufacturing the TFT substrate 100A will be described.

The method of manufacturing the TFT substrate 100A according to an embodiment of the present invention includes: a step (a) of preparing the substrate 2; a step (b) of forming the source electrode 3s and the drain electrode 3d on the substrate 2; a step (c) of forming the oxide semiconductor layer 5 on the source electrode 3s and the drain electrode 3d; a step (d) of forming the insulating layer 8 on the oxide semiconductor layer 5; a step (e) of forming the gate electrode 9a on the insulating layer 8 to overlap a portion of the oxide semiconductor layer 5 when viewed in a direction normal to the substrate 2; a step (f) of forming the transparent electrode 7 by doping a portion of the oxide semiconductor layer 5 with an impurity, with the gate electrode 9a as a mask; and a step (g) of forming the transparent electrode 13 so as to overlap a portion of the transparent electrode 7 through the insulating layer 8.

The method of manufacturing the TFT substrate 100A may further include a step (h) of forming the light-shielding layer 21 on the substrate 2 between the step (a) and the step (b), and in the step (b), a portion of the oxide semiconductor layer 5 may be formed on the light-shielding layer 21.

With such a manufacturing method, it is possible to manufacture the TFT substrate 100A with a simple method without an increase in the number of steps while mitigating variation in electrical characteristics of the TFT 10A.

Next, an example of a method of manufacturing the TFT substrate 100A will be described in detail with reference to FIGS. 3 and 4.

Figure 3:
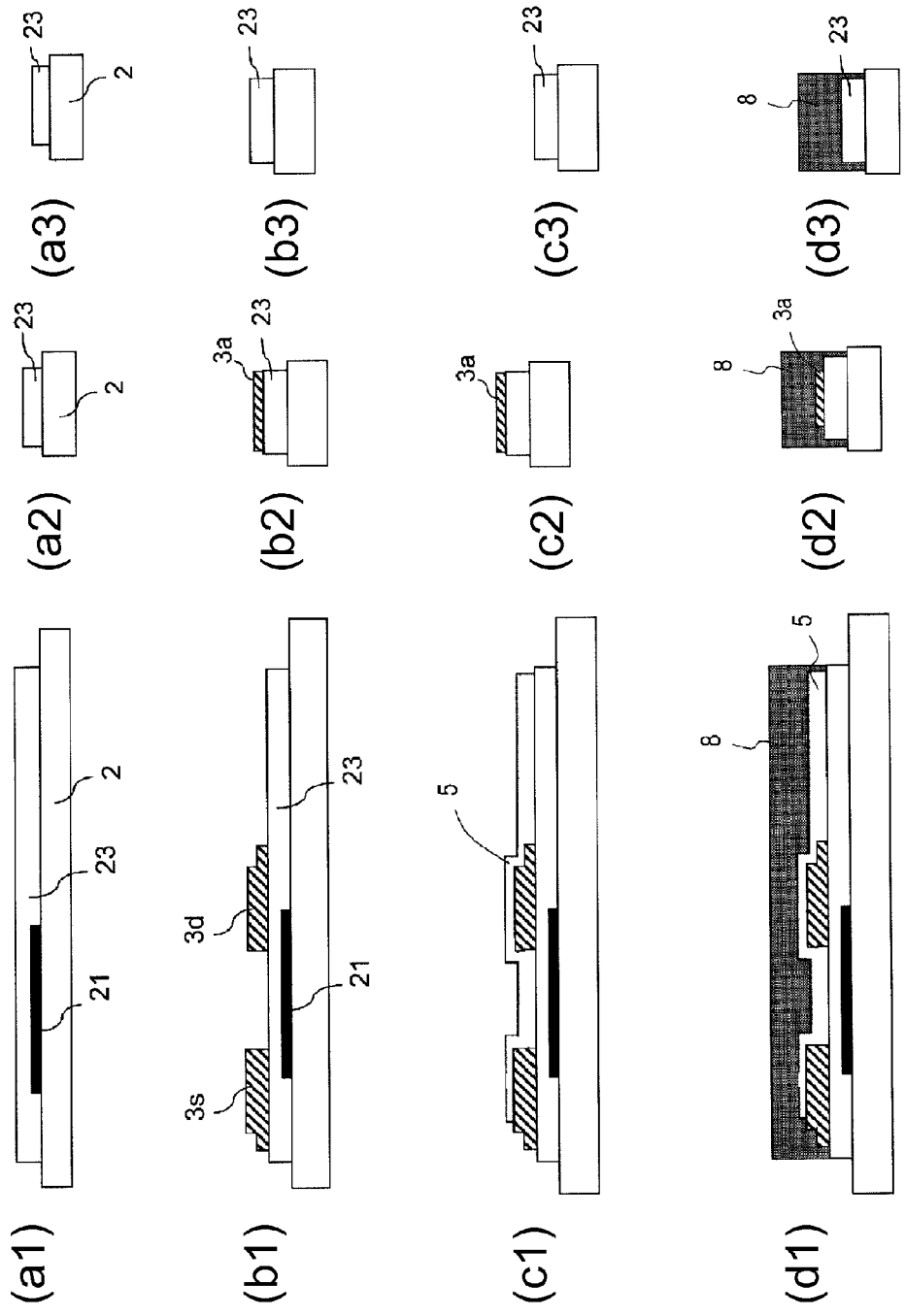
FIGS. 3(a1) to 3(d1), 3(a2) to 3(d2), and 3(a3) to 3(d3) are schematic cross-sectional views for respectively describing the method of manufacturing the TFT substrate 100A.

FIGS. 3(*a*) to 3(*d*1), 3(*a*2) to 3(*d*2), 3(*a*3) to 3(*d*3), 4(*a*1) to 4(*d*1), 4(*a*2) to 4(*d*2), and 4(*a*3) to 4(*d*3) are respectively schematic cross-sectional views for describing an example of a method of manufacturing a TFT substrate 100A. FIGS. 3(*a*1) to 3(*d*1) and 4(*a*1) to 4(*d*1) are schematic cross-sectional views respectively corresponding to FIG. 1(*b*). FIGS. 3(*a*2) to 3(*d*2) and 4(*a*2) to 4(*d*2) are schematic cross-sectional views respectively corresponding to FIG. 2(*a*). FIGS. 3(*a*3) to 3(*d*3) and 4(*a*3) to 4(*d*3) are schematic cross-sectional views respectively corresponding to FIG. 2(*b*). In FIGS. 3 and 4, an example of a method of manufacturing the TFT substrate 100A having the light-shielding layer 21 and the buffer layer 23 will be described.

First, as shown in FIG. 3(*a*1), the light-shielding layer 21 is formed on the substrate 2. The light-shielding layer 21 is formed by a known method of a black resin, for example. The thickness of the light-shielding layer 21 is approximately 50 nm to 500 nm, for example. The light-shielding layer 21 is formed so as to overlap the region of the oxide layer 5 to become the semiconductor region 5s, as will be described later. Therefore, the light-shielding layer 21 is not formed in regions shown in FIGS. 3(*a*2) and 3(*a*3).

If the light-shielding layer 21 is formed as mentioned above, light does not hit the semiconductor region 5s of the oxide layer 5, and thus, leakage current resulting from light can be prevented in the oxide semiconductor TFT.

Next, as shown in FIG. 3(*a*1), the buffer layer 23 is formed on the light-shielding layer 21 by CVD (chemical vapor deposition). The buffer layer 23 can be made of a single layer or multiple layers of $SiO_2$ (silicon oxide), $SiN_X$ (silicon nitride), $SiO_XN_Y$ (silicon nitride oxide, x>y), $SiN_XO_Y$ (silicon oxide nitride, x>y), $Al_2O_3$ (aluminum oxide), or tantalum oxide ($Ta_2O_5$), for example. The thickness of the buffer layer 23 is approximately 50 nm to 600 nm, for example. The buffer layer 23 has an upper layer made of $SiO_2$, for example, and a lower layer made of $SiN_X$, for example. The upper layer and the lower layer are respectively approximately 100 nm in thickness, for example.

In the regions shown in FIGS. 3(*a*2) and 3(*a*3), the buffer layer 23 is formed on the substrate 2.

Next, as shown in FIG. 3(*b*1), the source electrode 3s and the drain electrode 3d are formed on the buffer layer 23. In the region shown in FIG. 3(*b*2), the source connective layer 3a is formed on the buffer layer 23. In the region shown in FIG. 3(b3), the buffer layer 23 remains exposed. The source electrode 3s, the drain electrode 3d, and the source connective layer 3a are formed of a conductive film (not shown) by sputtering and obtained by patterning this conductive film by a known method. Here, the conductive film forming the source electrode 3s, the drain electrode 3d, and the source connective layer 3a has a layered structure of Ti/Al/Ti, for example. The thickness of the lower Ti layer is approximately 50 nm, the thickness of the Al layer is approximately 200 nm, and thickness of the upper Ti layer is approximately 100 nm.

Next, as shown in FIG. 3(c1), after an oxide semiconductor film (not shown) is formed by sputtering, the oxide semiconductor film is patterned by a known method to form the oxide semiconductor layer 5 (oxide layer). Portions of the oxide semiconductor layer 5 are formed on the source electrode 3s and the drain electrode 3d, and overlap the light-shielding layer 21 through the buffer layer 23. In regions shown in FIGS. 3(c2) and 3(c3), the oxide semiconductor layer 5 is not formed. The thickness of the oxide semiconductor layer 5 is approximately 50 nm, for example.

Next, as shown in FIG. 3(d1), the insulating layer 8 is formed by CVD or the like on the oxide semiconductor layer 5. The insulating layer 8 can be formed of $SiO_2$ (silicon oxide), $SiN_X$ (silicon nitride), $SiO_XN_Y$ (silicon nitride oxide, x>y), $SiN_XO_Y$ (silicon oxide nitride, x>y), $Al_2O_3$ (aluminum oxide), or tantalum oxide ($Ta_2O_5$), for example. The insulating layer 8 is made of $SiO_2$, for example, and the thickness thereof is approximately 400 nm, for example. Also, as shown in FIG. 3(d2), the insulating layer 8 is formed to cover the source connective layer 3a. Furthermore, as shown in FIG. 3(d3), the insulating layer 8 is formed on the buffer layer 23.

Figure 4:
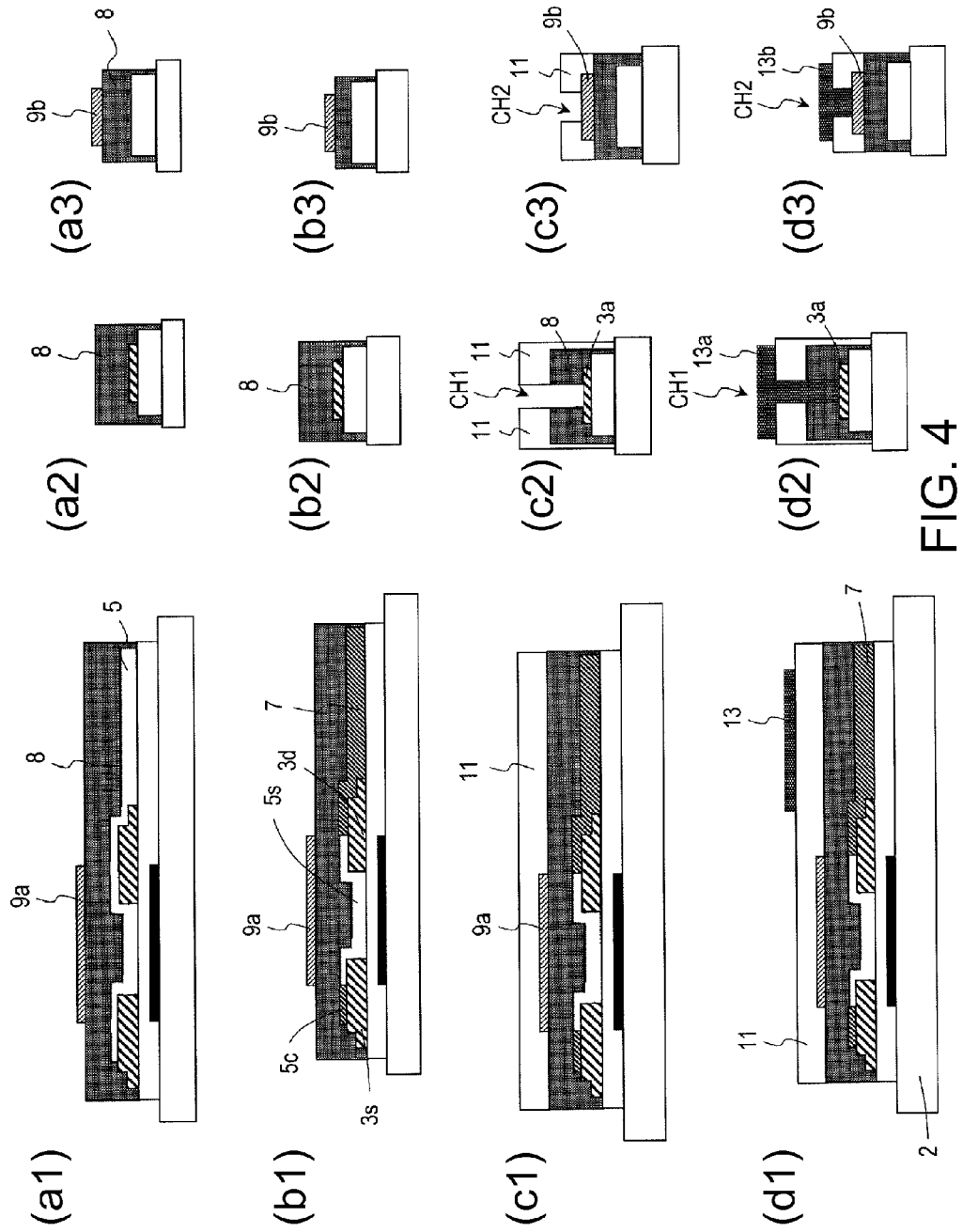
FIGS. 4(a1) to 4(d1), 4(a2) to 4(d2), and 4(a3) to 4(d3) are schematic cross-sectional views for respectively describing the method of manufacturing the TFT substrate 100A.

Next, as shown in FIG. 4(a1), the gate electrode 9a is formed by sputtering or the like on the insulating layer 8. The gate electrode 9a is formed so as to overlap the semiconductor region 5s of the oxide semiconductor layer 5 through the insulating layer 8. Also, the gate connective layer 9b is formed by sputtering or the like on the insulating layer 8 in the region shown in FIG. 4(a3). In the region shown in FIG. 4(a2), the insulating layer 8 remains exposed.

The gate electrode 9a and the gate connective layer 9b have a layered structure of Mo (molybdenum)/Al (aluminum)/Mo, for example. The gate electrode 9a and the gate connective layer 9b are approximately 420 nm in thickness, respectively, for example.

Next, as shown in FIG. 4(b1), a portion of the oxide semiconductor layer 5 is doped with an impurity (boron (B), for example) through the insulating layer 8 with the gate electrode 9a as a mask, and a portion of the oxide semiconductor layer 5 is reduced by the doped impurity, thus forming the transparent electrode 7 and the conductive region 5c. The conductive region 5c is formed on the source electrode 3s. A portion of the transparent electrode 7 is formed on the drain electrode 3d. The region of the oxide semiconductor layer 5 that is not doped with the impurity remains as the semiconductor region 5s. The doping of the impurity is performed in a self-aligned manner with respect to the gate electrode 9a.

If impurity doping is performed using a resist film made of a photomask or the like as a mask, for example, then misalignment or the like between the positions of the resist film and the oxide semiconductor layer 5 occurs, which can result in variation in channel length of the semiconductor region 5s, resulting in a variation in threshold voltage in the oxide semiconductor TFT. In the present embodiment, the doping of the impurity is performed in a self-aligned manner with respect to the gate electrode 9a, and thus, it is possible to mitigate variation in channel length in the semiconductor region 5s, for example, and as a result, it is possible to mitigate variation in threshold voltage in the oxide semiconductor TFT. Also, the impurity is doped without the use of a photomask, and thus, manufacturing cost is reduced. Additionally, the active layer (semiconductor region 5s) of the oxide semiconductor TFT and the transparent electrode 7 that can function as an election can be formed from one oxide semiconductor layer, and thus, the manufacturing process can be simplified and the manufacturing cost can be reduced.

As described above, the transparent electrode 7 and the conductive region 5c are formed by doping an impurity, and thus, the transparent electrode 7 and the conductive region 5c include the impurity at a higher concentration than the semiconductor region 5s. The doping of the impurity is performed through the insulating layer 8, and thus, the portion of the insulating layer 8 on the transparent electrode 7 includes the impurity at a higher concentration than in other portions.

Next, as shown in FIG. 4(c1), the protective layer 11 is formed by CVD or the like so as to cover the gate electrode 9a. As shown in FIG. 4(c2), the protective layer 11 is formed on the insulating layer 8. Next, as shown in FIG. 4(c3), the protective layer 11 is formed to cover the gate connective layer 9b. The protective layer 11 is made of $SiO_2$, for example, and the thickness thereof is approximately 200 nm, for example.

Next, as shown in FIGS. 4(c2) and 4(c3), the contact holes CH1 and CH2 exposing portions of the source connective layer 3a and the gate connective layer 9b are formed by a known method. Next, as shown in FIG. 4(c2), the contact hole CH1 is formed in the insulating layer 8 and the protective layer 11. As shown in FIG. 4(c3), the contact hole CH2 is formed in the protective layer 11.

Next, as shown in FIG. 4(d1), the transparent electrode 13 is formed on the protective layer 11 by sputtering. When viewed from the direction normal to the substrate 2, the transparent electrode 13 is formed such that at least a portion thereof overlaps the transparent electrode 7. As shown in FIG. 4(d2), the transparent connective layer 13a, which is electrically connected to the source connective layer 3a through the contact hole CH1, is also formed. Also, as shown in FIG. 4(d3), the transparent connective layer 13b, which is electrically connected to the gate connective layer 9b through the contact hole CH2, is also formed. The transparent connective layers 13a and 13b and the transparent electrode 13 are not electrically connected to each other.

The transparent electrode 13 and the transparent connective layers 13a and 13b are made of ITO, for example, and the thickness thereof is approximately 100 nm, for example.

According to the method above, it is possible to manufacture the TFT substrate 100A while mitigating variation in TFT characteristics and without an increase in the number of manufacturing steps or masks.

Figure 5:
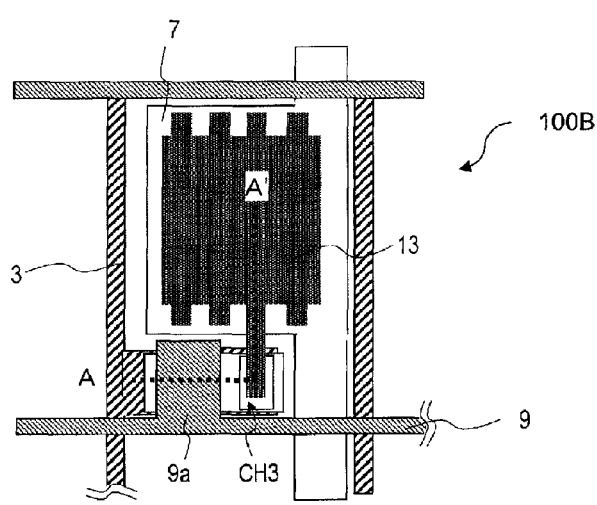
FIG. 5(a) is a schematic plan view of a TFT substrate 100B in another embodiment of the present invention.
FIG. 5(b) is a schematic cross-sectional view of the TFT substrate 100B along the line A-A' of FIG. 5(a).
Figure 5:
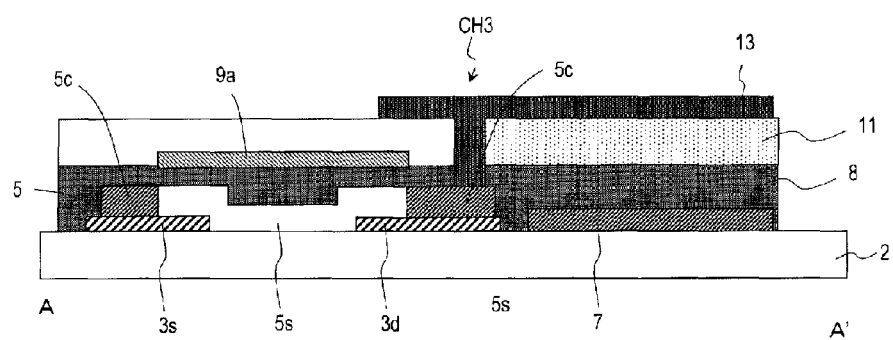

Next, a TFT substrate 100B of another embodiment of the present invention will be described with reference to FIG. 5. FIG. 5(a) is a schematic plan view of a TFT substrate 100B, and FIG. 5(b) is a schematic cross-sectional view of the TFT substrate 100B along the line A-A' of FIG. 5(a). The TFT substrate 100B also has a source terminal 51 and a gate terminal 52, but these are not shown in FIG. 5. Also, components that are shared with the TFT substrate 100A will be assigned the same reference characters, and duplicate explanations will be avoided.

The main difference between the TFT substrate 100B and the TFT substrate 100A is that the transparent electrode 7 is not electrically connected to the drain electrode 3d, and that the transparent electrode 13 is electrically connected to the drain electrode 3d.

Specifically, the TFT substrate 100B has an oxide layer 5 formed on the source electrode 3s and the drain electrode 3d, and a transparent electrode 7 that is not connected to the source electrode 3s or the drain electrode 3d. The oxide layer 5 has two conductive regions 5c and a semiconductor region 5s located therebetween. One of the two conductive regions 5c is formed on the source electrode 3s and the other is formed on the drain electrode 3d. The oxide layer 5 and the transparent electrode 7 are formed of the same oxide film (In—Ga—Zn—O film, for example), but the oxide layer 5 and the transparent electrode 7 are not connected to each other.

The transparent electrode 13 is electrically connected to the drain electrode 3d through a contact hole CH3 formed in the insulating layer 8 and the protective layer 11. Furthermore, the transparent electrode 13 is in contact with the conductive region 5c of the oxide layer 5 formed on the drain electrode 3d, and is not in contact with the drain electrode 3d. The transparent electrode 13 is electrically connected to the drain electrode 3d through the conductive region 5c formed on the drain electrode 3d.

In the TFT substrate 100B, the transparent electrode 13 functions as a pixel electrode, for example, and the transparent electrode 7 functions as a common electrode, for example. The TFT substrate 100B having such a configuration can be applied to a greater variety of liquid crystal display modes (TN (twisted nematic) or VA (vertical alignment) modes, for example) than the TFT substrate 100A in which the pixel electrodes are located closer to the substrate 2 than the common electrode. The layout of the transparent electrode 13 is appropriately determined by the liquid crystal display device mode.

Figure 6:
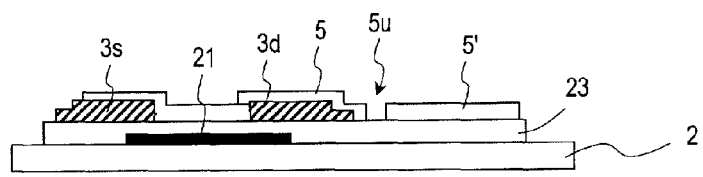
FIGS. 6(a) to 6(f) are schematic cross-sectional view for respectively describing the method of manufacturing the TFT substrate 100B.
Figure 6:
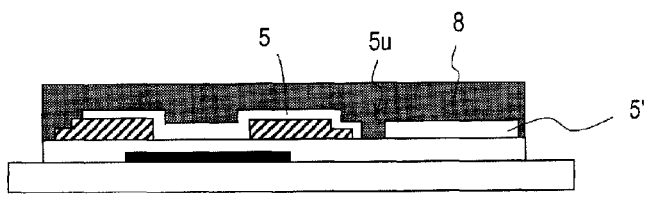
Figure 6:
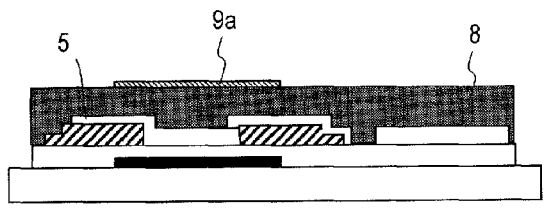
Figure 6:
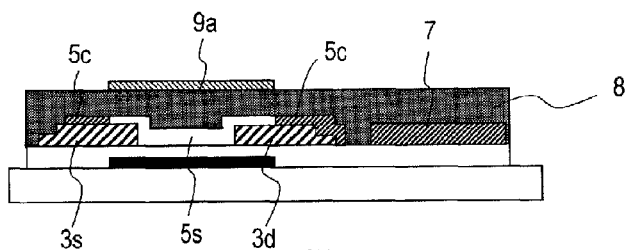
Figure 6:
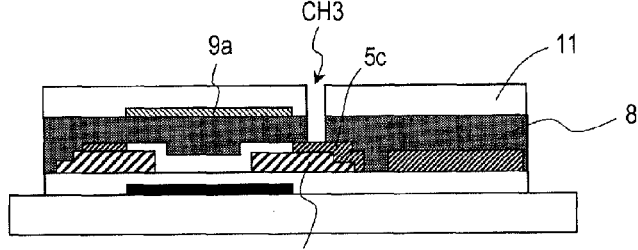
Figure 6:
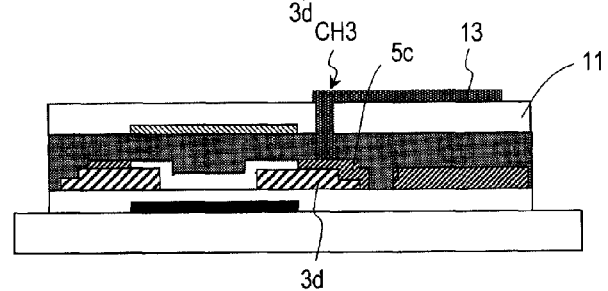

Next, a method of manufacturing the TFT substrate 100B of another embodiment of the present invention will be described with reference to FIG. 6. In FIG. 6, a method of manufacturing the TFT substrate 100B having a light-shielding layer 21 and a buffer layer 23 is shown, and the method of forming the source terminal 51 and the gate terminal 52 is the same as in the TFT substrate 100A, and thus, depictions thereof are omitted.

FIGS. 6(a) to 6(f) are schematic cross-sectional views for describing an example of a method of manufacturing a TFT substrate 100B.

In the method above, it is possible to form the light-shielding layer 21, the buffer layer 23, the source electrode 3s, and the drain electrode 3d on the substrate 2 (see FIGS. 3(a1) and 3(b1)).

As shown in FIG. 6(a), an oxide semiconductor film (not shown) is formed by sputtering or the like on the source electrode 3s and the drain electrode 3d, and by patterning by a known method, an oxide semiconductor layer 5 formed on the source electrode 3s and the drain electrode 3d, and an oxide semiconductor layer 5', which is not in contact with the oxide semiconductor layer 5, are formed. A portion of the oxide semiconductor layer 5 overlaps the light-shielding layer 21 when viewed in the direction normal to the substrate 2. The oxide semiconductor layer 5' is not electrically connected to the source electrode 3s, the drain electrode 3d, or the oxide semiconductor layer 5. An opening region 5u is formed between the oxide semiconductor layer 5 and the oxide semiconductor layer 5'.

Next, as shown in FIG. 6(b), the insulating layer 8 is formed on the oxide semiconductor layers 5 and 5' by the method mentioned above. The insulating layer 8 covers the opening region 5u.

Next, as shown in FIG. 6(c), the gate electrode 9a is formed on the insulating layer 8 by the method mentioned above. The gate electrode 9a covers the area of the oxide semiconductor layer 5 to become the channel region when viewed from the direction normal to the substrate 2.

Next, as shown in FIG. 6(d), by the above-mentioned method, at least a portion of the oxide semiconductor layer 5' and a portion of the oxide semiconductor layer 5 is doped with an impurity (boron (B), for example) with the gate electrode 9a as a mask, the transparent electrode 7 is formed of the oxide semiconductor layer 5', and a portion of the oxide semiconductor layer 5 becomes the conductive region 5c. The region of the oxide semiconductor layer 5 that is not doped with the impurity remains as the semiconductor region 5s. The conductive region 5c is formed on the drain electrode 3d and/or the source electrode 3s, for example. The semiconductor region 5s is a region that can include the channel region.

Next, as shown in FIG. 6(e), the protective layer 11 is formed on the gate electrode 9a by the above-mentioned method. Then, by a known method, a contact hole CH3 exposing a portion of the conductive region 5c located on the drain electrode 3d is formed in the protective layer 11 and the insulating layer 8.

Next, as shown in FIG. 6(f), the transparent electrode 13 is formed on the protective layer 11 by the method above. The transparent electrode 13 is in contact with the conductive region 5c in the contact hole CH3 and electrically connected to the drain electrode 3d. In other words, the transparent electrode 13 is electrically connected to the drain electrode 3d through the conductive region 5c.

The TFT substrate 100B is manufactured as described above.

Next, a TFT substrate 100C of yet another embodiment of the present invention will be described with reference to FIG. 7. Components that are shared with the TFT substrate 100A will be assigned the same reference characters, and duplicate explanations will be avoided.

Figure 7:
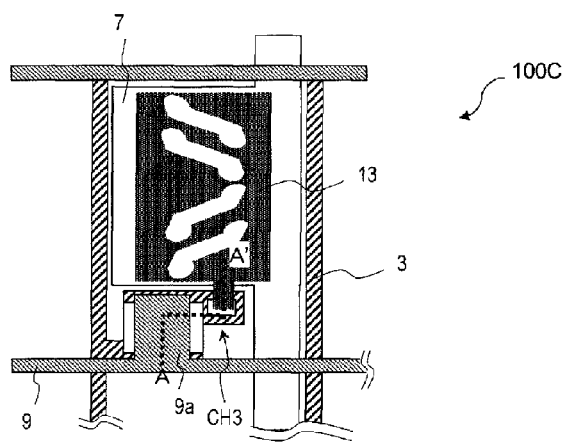
FIG. 7(a) is a schematic plan view of a TFT substrate 100C in yet another embodiment of the present invention.
FIG. 7(b) is a schematic cross-sectional view of the TFT substrate 100C along the line A-A' of FIG. 7(a).
Figure 7:
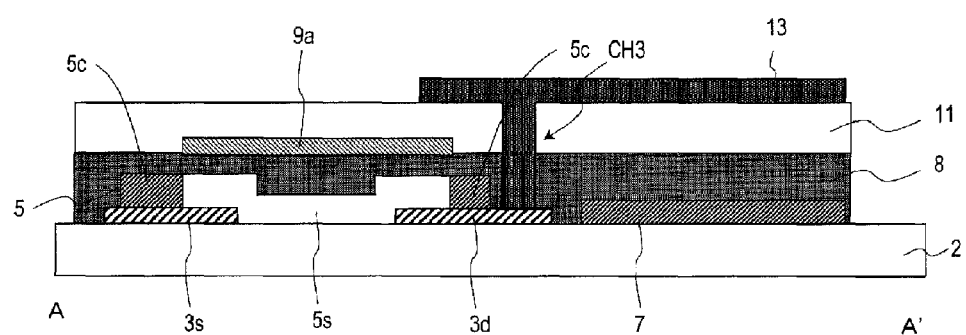

FIG. 7(a) is a schematic plan view of a TFT substrate 100C, and FIG. 7(b) is a schematic cross-sectional view of the TFT substrate 100C along the line A-A' of FIG. 7(a). The TFT substrate 100C also has a source terminal 51 and a gate terminal 52, but these are not shown in FIG. 7.

The TFT substrate 100C differs from the TFT substrate 100B in that the transparent electrode 13 and the drain electrode 3d are electrically connected to each other by the transparent electrode 13 being in contact with the drain electrode 3d through a contact hole CH3. As a result, the reliability of the electrical connection between the transparent electrode 13 and the drain electrode 3d is improved. The TFT substrate 100C may also have the light-shielding layer 21 and the buffer layer 23 mentioned above.

The method of manufacturing the TFT substrate 100C is the same as that of the TFT substrate 100B, and thus, descriptions thereof are omitted.

By the embodiments of the present invention above, a semiconductor device and a method of manufacturing the same by which it is possible to attain a display device having a higher resolution and higher aperture ratio than conventional devices without an increase in manufacturing cost are provided. Also, a semiconductor device and a method of manufacturing the same by which there is little variation in electrical characteristics of the TFTs are provided.

INDUSTRIAL APPLICABILITY

The embodiments of the present invention can be widely applied to devices provided with: thin film transistors such as circuit substrates including active matrix substrates; display devices including liquid crystal display devices, organic electroluminescent (EL) display devices, and inorganic electroluminescent display devices; imaging devices such as image sensor devices; and electronic devices such as image input devices and fingerprint readers.

DESCRIPTION OF REFERENCE CHARACTERS 2 substrate
3 source wiring line
3a source connective layer
3s source electrode
3d drain electrode
5 oxide layer (oxide semiconductor layer)
5s semiconductor region
5c conductive region
7, 13 transparent electrode
8 insulating layer
9 gate wiring line
9a gate electrode
11 protective layer
100A, 100B, 100C TFT substrate

What is claimed is:

1. A semiconductor device, comprising:
   a substrate;
   a source electrode, a drain electrode, and a first transparent electrode formed on the substrate;
   an oxide layer electrically connected to the source electrode and the drain electrode, the oxide layer including a semiconductor region;
   an insulating layer formed on the oxide layer and the first transparent electrode;
   a gate electrode formed on the insulating layer; and
   a second transparent electrode formed over the insulating layer, overlapping at least a portion of the first transparent electrode,
   wherein the oxide layer and the first transparent electrode are formed of a same oxide film.

2. The semiconductor device according to claim 1, wherein the second transparent electrode is electrically connected to the drain electrode.

3. The semiconductor device according to claim 2,
   wherein the oxide layer includes a conductive region, and
   wherein the second transparent electrode is electrically connected to the drain electrode through the conductive region.

4. The semiconductor device according to claim 1, wherein the first transparent electrode is electrically connected to the drain electrode.

5. The semiconductor device according to claim 1,
   wherein the first transparent electrode includes an impurity at a higher concentration than in the semiconductor region, and
   wherein a portion of the insulating layer located over the first transparent electrode includes an impurity at a higher concentration than in other portions of the insulating layer.

6. The semiconductor device according to claim 1, further comprising:
   a light-shielding layer formed on the substrate,
   wherein the semiconductor region is formed on the light-shielding layer.

7. The semiconductor device according to claim 1, wherein the oxide film includes In, Ga, and Zn.

8. A method of manufacturing a semiconductor device, comprising:
   (a) preparing a substrate;
   (b) forming a source electrode and a drain electrode on the substrate;
   (c) forming an oxide semiconductor layer on the source electrode and the drain electrode;
   (d) forming an insulating layer on the oxide semiconductor layer;
   (e) forming a gate electrode on the insulating layer so as to overlap a portion of the oxide semiconductor layer when viewed from a direction normal to the substrate;
   (f) forming a first transparent electrode by doping a portion of the oxide semiconductor layer with an impurity using the gate electrode as a mask; and
   (g) forming a second transparent electrode so as to overlap at least a portion of the first transparent electrode through the insulating layer.

9. The method of manufacturing a semiconductor device according to claim 8,
   wherein, in the step (c), the oxide semiconductor layer includes a first oxide semiconductor layer formed on the source electrode and the drain electrode and a second oxide semiconductor layer not in contact with the first oxide semiconductor layer, and
   wherein the step (f) includes a step (f1) of forming the first transparent electrode by doping at least a portion of the second oxide semiconductor layer with the impurity.

10. The method of manufacturing a semiconductor device according to claim 9, wherein the step (f) includes a step (f2) of doping a portion of the first oxide semiconductor layer with the impurity.

11. The method of manufacturing a semiconductor device according to claim 8, further comprising:
    (h) forming a light-shielding layer on the substrate between the step (a) and the step (b),
    wherein, in the step (b), a portion of the oxide semiconductor layer is formed on the light-shielding layer.

12. The method of manufacturing a semiconductor device according to claim 8, wherein the oxide semiconductor layer includes In, Ga, and Zn.

* * * * *